United States Patent
Chen (10) Patent No.: US 10,955,486 B2
(45) Date of Patent: Mar. 23, 2021

(54) METHOD AND SYSTEM FOR ABNORMITY DETECTION OF A RECHARGEABLE BATTERY OF A TERMINAL DEVICE

(71) Applicant: GUANGDONG OPPO MOBILE TELECOMMUNICATIONS CORP., LTD., Guangdong (CN)

(72) Inventor: Wei Chen, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 16 days.

(21) Appl. No.: 16/207,467

(22) Filed: Dec. 3, 2018

(65) Prior Publication Data

US 2019/0113582 A1 Apr. 18, 2019

Related U.S. Application Data

(63) Continuation of application No. PCT/CN2017/099124, filed on Aug. 25, 2017.

(51) Int. Cl.
*G01R 31/392* (2019.01)
*H02J 7/00* (2006.01)
*G01R 31/367* (2019.01)

(52) U.S. Cl.
CPC ......... *G01R 31/392* (2019.01); *G01R 31/367* (2019.01); *H02J 7/0029* (2013.01); *H02J 7/0047* (2013.01)

(58) Field of Classification Search
CPC ... G01R 31/392; G01R 31/367; H02J 7/0029; H02J 7/0047

USPC .......................................................... 320/137
See application file for complete search history.

(56) References Cited

U.S. PATENT DOCUMENTS

| | | | |
|---|---|---|---|
| 2011/0084702 A1* | 4/2011 | Mori ................... | G01R 31/392 324/430 |
| 2011/0128006 A1* | 6/2011 | Ren ..................... | G01R 31/392 324/426 |
| 2014/0129163 A1 | 5/2014 | Betzner | |
| 2016/0036096 A1* | 2/2016 | Yoshida .............. | H01M 10/482 429/50 |
| 2017/0126027 A1 | 5/2017 | Park | |

(Continued)

FOREIGN PATENT DOCUMENTS

| | | |
|---|---|---|
| CN | 101304568 A | 11/2008 |
| CN | 102565611 A | 7/2012 |

(Continued)

OTHER PUBLICATIONS

Extended European search report issued in corresponding European application No. 17910506.9 dated Jul. 1, 2019.

(Continued)

*Primary Examiner* — Nathaniel R Pelton (57) ABSTRACT

A method for monitoring battery safety is provided. When a terminal device remains coupled with an adaptor after charging of a battery of the terminal device is completed, in response to the terminal device being in a low-power state, recharge information of the terminal device is acquired. According to the recharge information of the terminal device, whether the battery is abnormal is determined. The disclosure further provides a system for monitoring battery safety and a non-transitory computer readable storage medium.

11 Claims, 4 Drawing Sheets

(56) References Cited

U.S. PATENT DOCUMENTS

| | | | |
|---|---|---|---|
| 2017/0279165 A1* | 9/2017 | Tanii | G01R 31/392 |
| 2017/0302090 A1* | 10/2017 | Han | H01M 10/42 |

FOREIGN PATENT DOCUMENTS

| | | |
|---|---|---|
| CN | 203014355 U | 6/2013 |
| CN | 103545564 A | 1/2014 |
| CN | 104078716 A | 10/2014 |
| CN | 104115365 A | 10/2014 |
| CN | 105721687 A | 6/2016 |
| CN | 105738831 A | 7/2016 |
| CN | 106025404 A | 10/2016 |
| CN | 106772084 A | 5/2017 |
| CN | 107064803 A | 8/2017 |
| DE | 102015110464 A1 | 1/2016 |
| EP | 1413894 A1 | 4/2004 |
| EP | 1450173 A2 | 8/2004 |
| WO | 2014154044 A1 | 10/2014 |
| WO | 2017006319 A1 | 1/2017 |

OTHER PUBLICATIONS

Tanvir Singh Mundra et al: An Innovative Battery Charger for Safe Charging of NiMH/NiCd Batteries IEEE Transactions on Consumer Electronics, IEEE Service Center, Nen York, NY, US, vol. 53, No. 3, Aug. 1, 2007 (Aug. 1, 2007), pp. 1044-1052. XP011193648 ISSN: 0098-3063 DOI:10.1109/TCE.2007.4341584.

OA1 with English Translation issued in corresponding CN application No. 201780033515.3 dated Oct. 30, 2020.

\* cited by examiner

METHOD AND SYSTEM FOR ABNORMITY DETECTION OF A RECHARGEABLE BATTERY OF A TERMINAL DEVICE

CROSS-REFERENCE TO RELATED APPLICATION(S)

This application is a continuation of International Application No. PCT/CN2017/099124, filed on Aug. 25, 2017, the disclosure of which is hereby incorporated by reference in its entirety.

TECHNICAL FIELD

This disclosure relates to the technical field of terminal device, and more particularly, to a method for monitoring battery safety, a system for monitoring battery safety, and a non-transitory computer readable storage medium.

BACKGROUND

A battery is a source of power for a terminal device such as a mobile phone and provides long-term steady power supply for the terminal device. The battery that was first used for the terminal device is a Nickel chromium battery or a Nickel-metal hydride (Ni-MH) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, safety monitor needs to be conducted on the battery to avoid accidents.

SUMMARY

According to a first aspect of the disclosure, a method for monitoring battery safety is provided. The method for monitoring battery safety includes the following operations. When a terminal device remains coupled with an adaptor after charging of a battery of the terminal device via the adaptor is completed, in response to the terminal device being in a low-power state, acquire recharge information of a terminal device. Determine whether the battery of the terminal device is abnormal according to the recharge information of the terminal device.

According to a second aspect of the disclosure, a system for monitoring battery safety is provided. The system for monitoring battery safety includes at least one processor and a computer readable storage. The computer readable storage is coupled to the at least one processor and stores at least one computer executable instruction thereon which, when executed by the at least one processor, causes the at least one processor to carry out the following actions. When the terminal device remains coupled with an adaptor after charging of a battery of the terminal device via the adaptor is completed, in response to the terminal device being in a low-power state, acquire recharge information of a terminal device. Determine whether the battery of the terminal device is abnormal according to the recharge information of the terminal device.

According to a third aspect of the disclosure, a non-transitory computer readable storage medium storing computer programs is provided. The computer programs, when executed by a processor, are operable with the processor carry out the following actions. When the terminal device remains coupled with an adaptor after charging of a battery of the terminal device via the adaptor is completed, in response to the terminal device being in a low-power state, acquire recharge information of a terminal device. Determine whether the battery of the terminal device is abnormal according to the recharge information of the terminal device.

DETAILED DESCRIPTION

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the method for monitoring battery safety, the system for monitoring battery safety, the terminal device with the system for monitoring battery safety, and the adaptor with the system for monitoring battery safety of implementations of the present disclosure are described, structure of a battery of the terminal device and existing potential safety hazard will be first described below.

For instance, a Lithium-ion battery mainly includes a cell and a battery protection system. The cell is referred to as the "heart" of the Lithium-ion battery and includes anode materials and cathode materials, electrolyte, isolation membrane, and housing, and outside is the battery protection system. The anode materials of the cell are Lithium molecular materials such as Lithium Manganate, Lithium Cobaltate, etc. and determine energy of the battery. The cathode material is graphite. The isolation membrane is set between the anode and the cathode of the battery. To make it easier to understand, the isolation membrane is like a piece of paper which is continuously folded within a small battery case and filled with the anode and cathode materials and the electrolyte. In a charging process, an external electric field activates Lithium molecules in the anode material to drive the Lithium molecules to the cathode to make the Lithium molecules be stored in gaps of a graphic electrode structure. More Lithium molecules being activated results in more energy stored. In a discharging process, Lithium ions in the cathode are driven to the anode and become the initial Lithium molecules in the anode. The above steps are repeated to achieve charging and discharging of the battery.

The isolation membrane is mainly configured to isolate completely the anode material from the cathode material. Once the anode material contacts directly the cathode material, a short circuit occurs inside the battery, thereby leading to some potential safety hazard. Therefore, the isolation membrane cannot be too thin since a thin isolation membrane tends to be damaged. However, with more requirements on the terminal device of users, such as a lighter and thinner terminal device, a larger screen, and longer battery life, manufacturers are made to search for a battery with higher energy density. For example, increase energy density by filling in more anode materials and more cathode materials. Nevertheless, for the same volume, more anode materials and more cathode materials filled in results in thinner isolation membrane. Since the isolation membrane tends to be damaged when the battery is subject to damage such as external impact, a short circuit will probably occur.

As an implementation, when the battery is subject to external mechanical damage such as squeezing, dropping, and piercing, due to thin isolation membrane, a short circuit between the anode and the cathode (that is, an internal short circuit within the battery) tends to occur because of damage of isolation membrane. Once the battery is damaged, due to the internal short circuit, there always exists current leakage in the damaged battery.

When the battery is subject to mechanical damage, only minor damage occurs mostly. For this reason, the battery which has the internal short circuit is difficult to identify, since such a battery still appears to be in a normal state. Nevertheless, such a battery where there exists the internal short circuit due to damage can still result in some potential safety hazard.

As another implementation, in the charging and discharging process of the battery, Lithium ion may accumulate in the anode and the cathode. When accumulation occurs, a type of dendrite, like crystal formed by many substances, is formed and can gradually become longer. The dendrite may also pierce the isolation membrane, thereby resulting in the internal short circuit in this process.

Once there is short circuit, when the battery is in use, large quantities of heat are produced inside the cell. The heat can result in vaporization of the electrolyte inside the cell. When the heat is produced too fast, the vaporization process can be very fast, which can cause increase in internal pressure of the cell. When the internal pressure reaches up to a certain extent, the housing is unable to bear the excessive pressure and thus can crack, thereby resulting in explosion. When the housing is in contact with open fire, the battery can burst into fire.

In addition, besides increasing energy density making isolation membrane increasingly thinner, and thinner isolation membrane resulting in damage of isolation membrane which causes accidents, quick charging is also one of major factors of potential safety hazard of the battery.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V (volt), a 100 mA (milliampere) charging current is adopted to pre-charge the battery. In the constant-current charging stage, a current feedback loop can be utilized to make current flowing into the battery in the constant-current charging stage satisfy expected charging current of the battery (such as a second charging current, which may be greater than the first charging current). Exemplarily, the charging current can range from 0.1 C (Coulomb) to several Coulombs according to different batteries, where C represents battery capacity. Generally, in the constant-current charging stage, a 0.1 C charging current is adopted for charging in a normal charging mode. However, in a quick charging mode, a charging current greater than 0.1 C is adopted for charging to complete charging within a short time period in the constant-current charging stage. In the constant-voltage charging stage, a voltage feedback loop can be utilized to make voltage applied to the battery in the constant-voltage charging stage satisfy expected charging voltage of the battery. Exemplarily, when voltage of the battery is equal to 4.2V, proceed to the constant-voltage charging stage, where charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2 C~0.8 C, or even up to 1 C) and the charging process of the battery is an electrochemical reaction, heat is certainly produced in this process. In addition, larger charging current leads to larger quantities of heat produced within a short time period. When the isolation membrane has been damaged, thereby causing the internal short circuit of part of the battery, more heat tends to be produced. Vaporization of the electrolyte occurs, which can cause increase in internal pressure of the cell. When the internal pressure reaches up to a certain extent, the housing is unable to bear the excessive pressure and thus can crack, thereby resulting in explosion. When the housing is in contact with open fire, the battery can burst into fire.

In other words, once there is internal short circuit of the battery, the battery is abnormal and thus some potential safety hazard exists, which may result in accidents when the battery is in use.

Inventors of the present disclosure, based on continuous research and experiments on batteries, finds that when a normal battery has been fully charged and is lightly loaded or with no load, voltage of the battery is steady in general. For example, when the terminal device is in a normal standby state (consuming current of the battery in a standby state is generally smaller than 200 mA), the terminal device will not trigger a recharge condition(s) within a certain time period. Whether the terminal device triggers the recharge condition can be determined by determining whether the voltage of the battery is lower than a recharge voltage threshold value. In general, the recharge voltage threshold value can be set between 4.15V and 4.25V, such as 4.2V. In this way, the terminal device triggers the recharge condition in response to the voltage of the battery being detected to be lower than 4.2V, when the terminal device is coupled with an adaptor.

When the battery is damaged, since the damaged battery has consuming-current of short circuit ("short circuit consuming-current" for short), the recharge condition can be triggered very easily.

Based on the above findings and a great number of experimental tests, in order to monitor effectively whether the battery is abnormal due to damage to avoid potential safety hazard of the battery, thereby avoiding accidents, an effective safety monitor method, aimed at detecting whether the battery is abnormal, is proposed in the present disclosure.

The following will describe the method for monitoring battery safety, the system for monitoring battery safety, the terminal device, and the adaptor according to implementations of the present disclosure with reference to the accompanying drawings.

In addition, it should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or other data connection lines or network connection lines. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with other communication terminals. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

Figure 1:
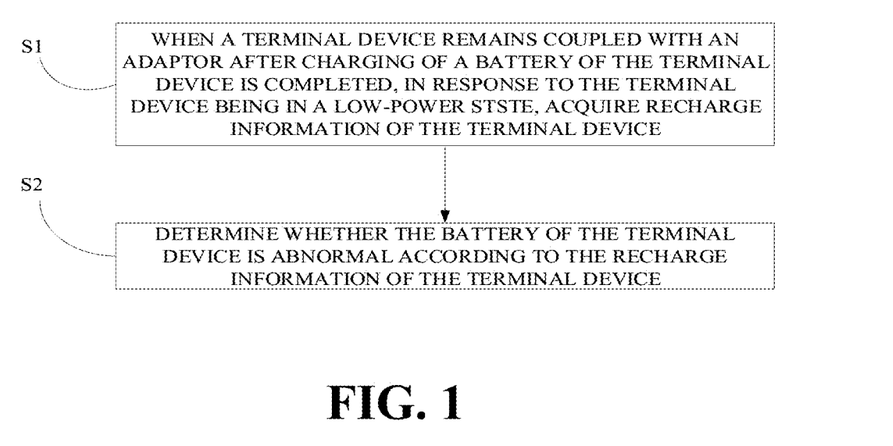
FIG. 1 is a flowchart illustrating a method for monitoring battery safety according to an implementation of the present disclosure.

FIG. 1 is a flowchart illustrating a method for monitoring battery safety according to implementations of the present disclosure. As illustrated in FIG. 1, the method for monitoring battery safety of the implementations of the present disclosure includes the following operations.

At S1, acquire recharge information of a terminal device, in response to the terminal device being in a low-power state, when the terminal device remains coupled with an adaptor after charging a battery of the terminal device via the adaptor is completed, that is, after the battery is fully charged.

In the implementations of the disclosure, the low-power state can include a standby state and a power off-state, that is, a battery is lightly loaded or with no load. The battery being with no load refers to the battery being not in a discharge state and there is no outside-consuming-current (not including self-consuming-current resulting from the internal short circuit of the battery), for example, when the terminal device is in the power off-state. The battery being lightly loaded refers to present consuming-current of the battery being approximately between 5 mA and 6 mA, that is, the consuming-current of the battery is very small, for example, when the terminal device is in the standby state or a lightly loaded state.

In addition, it should be noted that, the standby state refers to the display of the terminal device being in a screen off-state and all applications in the background being closed, with only applications related to the present disclosure in a launched state. That is to say, when safety monitor is conducted on the battery, the terminal device is kept in a state of nearly no power consumption, that is, the battery is kept in a natural discharge state, which can avoid inaccuracy in detection due to power consumption of the display or power consumption of applications.

In addition, charging of the terminal device being completed and the terminal device remaining coupled with the adaptor refers to the battery of the terminal device being fully charged and the adaptor being still coupled with the terminal device. In this state, the recharge information of the battery of the terminal device, such as the number of times of recharging, time interval of recharging, or the like, is acquired.

For instance, when an alternating current (AC) power supply is adopted to supply power, a majority of devices are unable to utilize AC to work. Instead, the AC, such as a 220V AC, received from the AC power supply is converted via the adaptor, such as a charger, and then is used for charging the battery of the terminal device.

As an implementation, the terminal device includes a charging management module, such as a charging integrated circuit (IC) of the terminal device. The charging management module is configured to manage charging voltage and/or charging current of the battery when the battery is charged. The charging management module functions as a voltage feedback module and/or a current feedback module to achieve management of the charging voltage and/or the charging current of the battery. At the same time, the terminal device can be configured to communicate with the adaptor and send information of the battery to the adaptor to manage the charging voltage and/or the charging current of the battery via the adaptor.

For example, when the battery is charged, a trickle charging can be conducted on the battery in the beginning. Then a constant-current charging and a constant-voltage charging can be conducted on the battery. When the charging voltage reaches up to 4.2V and the charging current is smaller than 100 mA, it can be determined that the battery is fully charged. Due to the fact that a user has not yet pulled the plug out of the adaptor (such as a charger), which indicates that the adaptor (such as the charger) is still coupled with the terminal device, whether to trigger the recharge condition can be determined by monitoring voltage of the battery and thus the recharge information of the terminal device can be acquired.

At S2, determine whether the battery of the terminal device is abnormal according to the recharge information of the terminal device.

When the battery of the terminal device is abnormal due to damage, the damaged battery can trigger the recharge condition very easily due to its self-consuming-current of short circuit.

Figure 2:
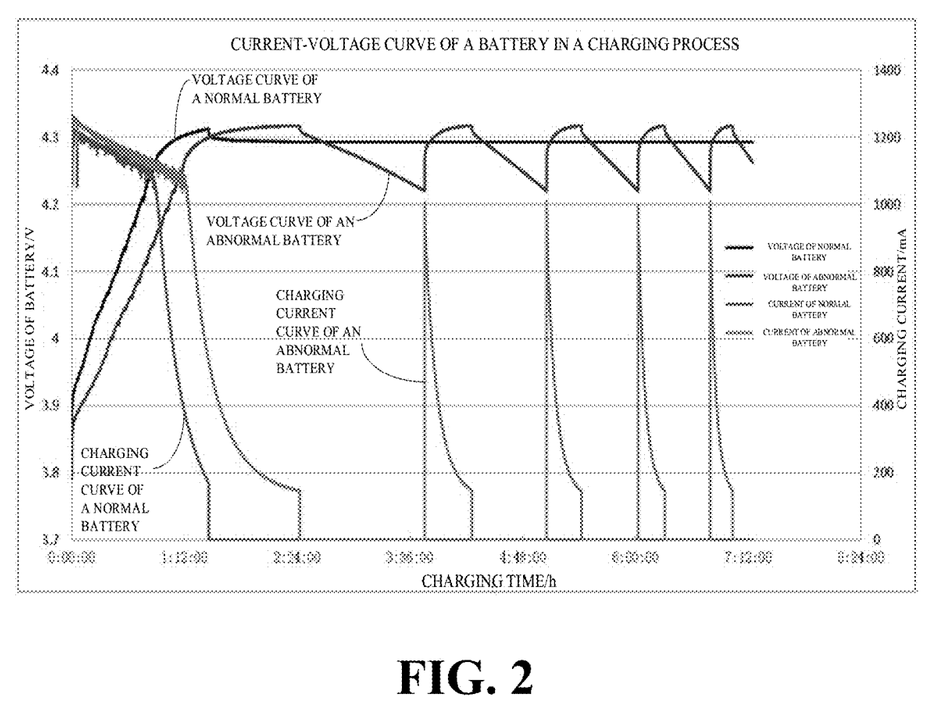
FIG. 2 is schematic diagram illustrating contrast between voltage curves of a normal battery and an abnormal battery and contrast between current curves of a normal battery and an abnormal battery in a charging process according to an implementation of the present disclosure.

Specifically, in an implementation of the disclosure, as illustrated in FIG. 2, a recharging voltage threshold value of the recharge condition is set to 4.25V. When the battery of the terminal device is abnormal due to damage, the recharge condition can be triggered multiple times within a certain time period. When the battery is recharged, charging current can increase, for example, in the case illustrated in FIG. 2, an abnormal battery is recharged at 3:36:00, 4:48:00, 6:00:00, and 7:12:00. When the battery is in a normal state, the voltage of the battery remains nearly constant, the recharge condition will not be triggered within a certain time period generally, and thus there is no recharging current. Still referring to FIG. 2, the voltage of a normal battery is constant 4.3V for example, while the voltage of an abnormal battery fluctuates and cannot remain constant in a time period from 2:24:00~7:12:00.

Therefore, in the implementations of the disclosure, when charging of the terminal device is completed and the terminal device stays coupled with the adaptor, in response to the terminal device being in a low-power state (excluding interference of power consumption of the terminal device itself), whether the battery of the terminal device is abnormal can be identified by monitoring the number of times the battery is recharged within a certain time, to avoid potential safety hazard caused by the abnormal battery.

According to an implementation of the disclosure, the recharge information of the terminal device includes the number of times the battery is recharged within a preset time and/or a time interval at which the battery is recharged. When we refer to "A and/or B" in the context, in means A alone, B alone, or both A and B. The term "and/or" can be replaced with "at least one of" without conflicts. For example, "at least one of A and B" means A alone, B alone, or both A and B.

The determining whether the battery of the terminal device is abnormal according to the recharge information of the terminal device includes the following. Determine whether the number of times the battery is recharged within a preset time is greater than a preset number of times and/or whether the time interval at which the battery is recharged is shorter than a preset time interval. Determine that the battery is abnormal, when the number of times the battery is recharged within a preset time is greater than or equal to a preset number of times and/or the time interval at which the battery is recharged is shorter than a preset time interval, where the preset time is longer than the preset time interval.

In other words, in an implementation of the disclosure, the recharge information of the terminal device can include the number of times the battery is recharged within a preset time. That is to say, when the terminal device remains coupled with the adaptor after charging of the terminal device is completed, in response to the terminal device being in a low-power state, monitor the number of times the recharge condition is triggered within a preset time such as several hours, and when the number of times the recharge condition is triggered is greater or equal to a preset number of times such as two to five times, it can be determined that there is some consuming-current of short circuit in the battery itself, which indicates that there is an internal short circuit in the battery, and that the battery is abnormal accordingly.

In another implementation of the disclosure, the recharge information of the terminal device can include the number of times the battery is recharged within a preset time and a time interval at which the battery is recharged. That is to say, when the terminal device remains coupled with the adaptor after charging of the terminal device is completed, in response to the terminal device being in a low-power state, monitor the number of times the recharge condition is triggered within a preset time such as several hours. At the same time, in order to improve accuracy in monitoring, monitor the time interval at which the recharge condition is triggered. When number of times the recharge condition is triggered within a preset time is greater or equal to a preset number of times such as two to five times and the time interval at which the recharge condition is triggered is shorter than a preset time interval such as half an hour to one hour and a half, it can be determined that there is some consuming-current of short circuit in the battery, which indicates that there is an internal short circuit of the battery, and that the battery is abnormal accordingly.

In implementations of the disclosure, the "recharge information" can be expressed in terms of recharge of the battery, or can be expressed in terms of the recharge condition mentioned above. Thus, the recharge information can refer to the number of times the battery is recharged within a preset time and/or a time interval at which the battery is recharged, from another point of view, the recharge information can refer to the number of times the recharge condition is triggered with in a preset time and/or a time interval at which the recharge condition is triggered. Whether the recharge condition is triggered can be determined by monitoring voltage of the battery for example. As mentioned before, a recharge voltage threshold such as 4.25 V can be set in advance, when the voltage of the battery is lower than such threshold, it indicates that the recharge condition is triggered.

In yet another implementation of the disclosure, the recharge information of the terminal device can include the time interval at which the battery is recharged. That is to say, when the terminal device remains coupled with the adaptor after charging of the terminal device is completed, in response to the terminal device being in a low-power state, monitor the time interval at which the recharge condition is triggered. When the time interval at which the recharge condition is triggered is shorter than a preset time interval such as half an hour to one hour and a half, it can be determined that there is some consuming-current of short circuit in the battery, which indicates that there is an internal short circuit in the battery, and that the battery is abnormal accordingly.

To summarize, according to the method for monitoring battery safety of implementations of the disclosure, when the terminal device remains coupled with the adaptor after charging of the terminal device is completed, in response to the terminal device being in a low-power state, monitor whether the battery of the battery is recharged and the recharge information of the battery of the terminal device to determine whether there is self-consuming current due to the internal short circuit of the battery, thereby identifying accurately whether the battery is abnormal.

It can be understood that, operations of executing monitor can be implemented by the terminal device or by the adaptor. In case that whether the battery is abnormal is monitored by the adaptor, the adaptor further communicates with the terminal device to send monitored information indicating that the battery is abnormal to the terminal device such that the terminal device can send alert information. Alternatively, the adaptor itself can also send the alert information, or both the terminal device and the adaptor can send the alert information simultaneously.

As an implementation, in case that whether the battery is abnormal is monitored by the terminal device, the terminal device further communicates with the adaptor to send the monitored information on the battery being abnormal to the adaptor and make the adaptor send alert information. Alternatively, the terminal device itself can also send the alert information, or both the terminal device and the adaptor can send the alert information simultaneously.

According to an implementation of the disclosure, when the battery is abnormal, alert information on the battery being abnormal is sent by the terminal device.

Figure 3:
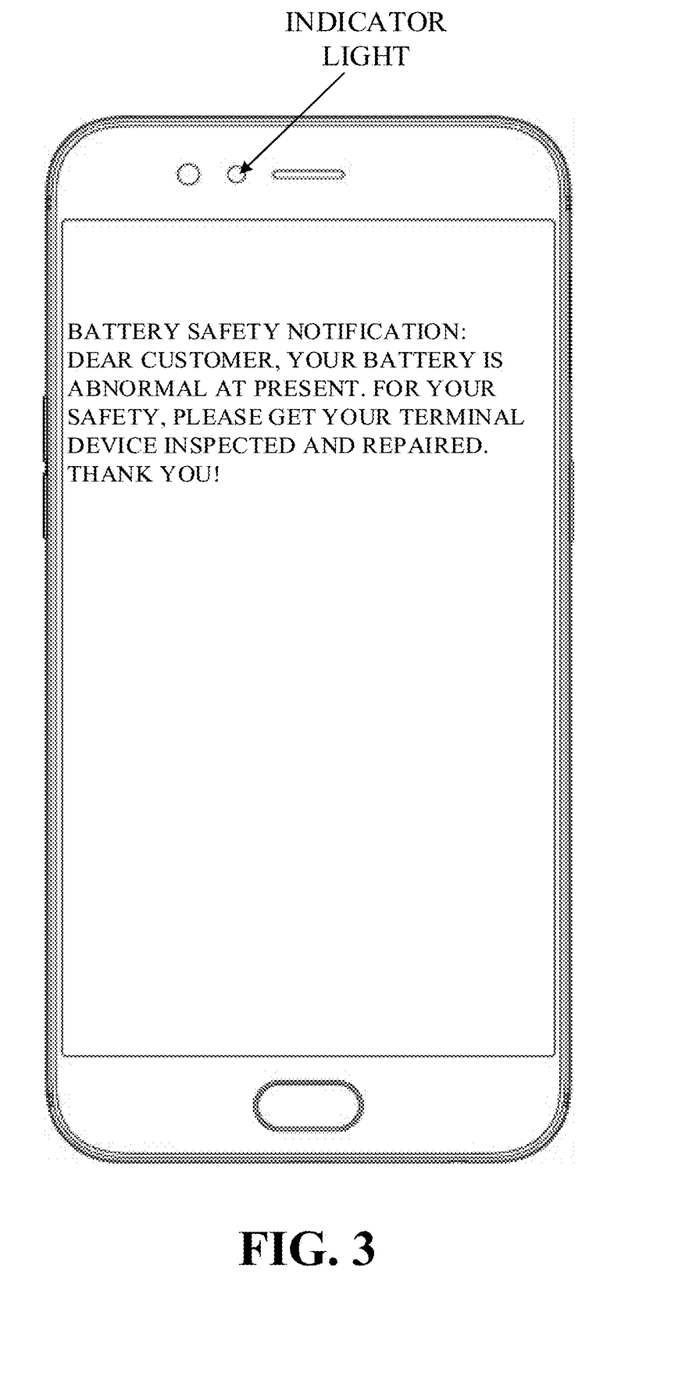
FIG. 3 is a schematic diagram illustrating alert information of a terminal device according to an implementation of the present disclosure.

For example, when the battery is monitored to be abnormal, it is necessary to send alert information to a user. As an implementation, as illustrated in FIG. 3, the user can be reminded by such alert information as "Battery safety notification: dear customer, your battery is abnormal due to damage at present. For your safety, please get your terminal device inspected and repaired at xxx branch of service. Thank you". As another implementation, when the user is reminded by the alert information illustrated in FIG. 3, the user can be further reminded by an indicator light flashing. For example, control the indicator light to flash in red light at a high frequency. As yet another implementation, the user can be further reminded by a voice announcement function of the terminal device.

In general, when the user receives the above alert information, the user can promptly get the terminal device inspected and repaired. However, some users fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In an implementation of the disclosure, when the battery is abnormal, a fault grade is determined according to the number of times the battery is recharged within a preset time and/or the time interval at which the battery is recharged and corresponding functions of the terminal device are restricted according to the fault grade.

For example, to restrict functions of the terminal device, correspondence relationship between functions of the terminal device and fault grades can be established in advance. Based on the correspondence relationship established, after the fault grade is determined, functions corresponding thereto can be determined either. The functions determined as such can be restricted or disabled within a preset period of time, or can be restricted or disabled until the fault of the terminal device is solved. The functions referred to herein can be applications or other functions come with the system of the terminal device, which is not limited herein.

It can be understood that, when an internal short circuit of the battery occurs due to damage of the battery, an extent of the internal short circuit varies with an extent of the damage, and corresponding consuming current of short circuit also differs. In general, a larger extent of damage results in a larger extent of the internal short circuit and greater short circuit self-consuming current, thereby resulting in a greater number of times the battery is recharged within a preset time and/or a shorter interval at which the battery is recharged. Therefore, the fault grade can be determined according to the number of times the battery is recharged within a preset time and/or the time interval at which the battery is recharged.

For example, damage of the battery can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device are restricted according to the fault grade.

In an implementation of the disclosure, the fault grade of the battery can be determined by the adaptor and then fault grade information is sent to the terminal device to restrict corresponding functions of the terminal device.

In another implementation of the disclosure, the fault grade of the battery can be also determined by the terminal device and then some functions of the terminal device are restricted according to the fault grade.

For instance, generally speaking, lower power consumption of applications of the terminal device leads to lower heating when the battery is in use. Exemplarily, an instant messaging (IM) application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the fault grade is the average grade, forbid use of applications of high power consumption such as video applications, game applications, etc.; in case that the fault grade is the relatively serious grade or the serious grade, forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display of the terminal device to remind the user; in case that the fault grade is the complete fault grade, battery failure occurs and the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "due to damage of the battery, charging of the battery is forbidden. Please get the terminal device inspected and repaired at xxx branch of service. Thank you for your cooperation" is displayed on the display of the terminal device to remind the user.

According to the method for monitoring battery safety according to implementations of the disclosure, when the terminal device remains coupled with the adaptor after charging of the terminal device is completed, in response to the terminal device being in a low-power state, acquire the recharge information of the terminal device to determine whether the battery of the terminal device is abnormal according to the recharge information of the terminal device. That is to say, when the battery is damaged, a short circuit occurs inside the battery. Due to an internal short circuit, there always exists current leakage in the damaged battery. In this way, after charging of the battery of the terminal device is completed, whether the battery is abnormal due to damage can be accurately monitored by monitoring the recharge information of the battery. When the battery is monitored to be abnormal, prompt alert and repair can be conducted to avoid potential safety hazard caused by the abnormal battery, which can substantially improve safety of the terminal device in use.

In addition, a non-transitory computer readable storage medium is provided in implementations of the disclosure. The non-transitory computer readable storage medium stores computer programs which, when executed by a processor, are operable with the processor to execute the above method for monitoring battery safety.

According to the non-transitory computer readable storage medium, by executing the above method for monitoring battery safety, after charging of the battery of the terminal device is completed, whether the battery is abnormal due to damage can be accurately monitored by monitoring the recharge information of the battery. When the battery is monitored to be abnormal, prompt alert and repair can be conducted to avoid potential safety hazard caused by the abnormal battery, which can substantially improve safety of the terminal device in use.

As one implementation, a non-transitory computer readable storage medium storing computer programs is provided. The programs, when executed by a processor, are operable with the processor carry out the following actions. Acquire recharge information of a terminal device, in response to the terminal device being in a low-power state, when the terminal device remains coupled with an adaptor after charging of a battery of the terminal device via the adaptor is completed; and determine whether the battery of the terminal device is abnormal according to the recharge information of the terminal device.

For example, the recharge information is acquired by monitor voltage of the battery.

The recharge condition is that the voltage of the battery being less than a voltage threshold, and the recharge information can be at least one of: the number of times a recharge condition is triggered within a preset time, and a time interval at which the recharge condition is recharged.

In one implementation, the battery of the terminal device is abnormal when the number of times the recharge condition is triggered within the preset time is greater than a preset number of times. In another implementation, the battery of the terminal device is abnormal when the time interval at which the recharge condition is triggered is shorter than a preset time interval. In still another implementation, the battery of the terminal device is abnormal when the number of times the recharge condition is triggered within the preset time is greater than a preset number of times and the time interval at which the recharge condition is triggered is shorter than a preset time interval.

Figure 4:
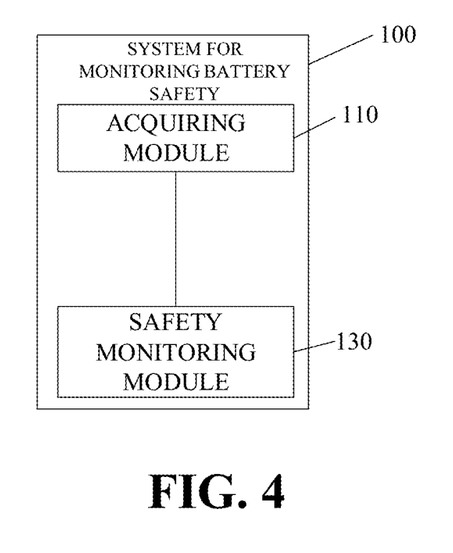
FIG. 4 is a schematic block diagram illustrating a system for monitoring battery safety according to an implementation of the present disclosure.

FIG. 4 is a schematic block diagram illustrating a system for monitoring battery safety according to an implementation of the disclosure. As illustrated in FIG. 4, the system for monitoring battery safety according to the implementation of the disclosure includes an acquiring module 110 and a safety monitoring module 130.

The acquiring module 110 is configured to acquire recharge information of a terminal device, in response to the terminal device being in a low-power state, when the terminal device remains coupled with an adaptor after charging of the terminal device is completed.

In the implementation of the disclosure, the low-power state can include a standby state, and a power off-state, that is, a battery is lightly loaded or with no load. The battery being with no load refers to the battery being not in a discharge state and there is no outside-consuming-current (not including self-consuming-current resulting from the internal short circuit of the battery), for example, when the terminal device is in the power off-state. The battery being lightly loaded refers to present consuming-current of the battery being approximately between 5 mA and 6 mA, that is, the consuming-current of the battery is very small, for example, when the terminal device is in the standby state or a lightly loaded state.

In addition, it should be noted that, the standby state refers to the display of the terminal device being in a screen off-state and all applications in the background being closed, with only applications related to the present disclosure in a launched state. That is to say, when safety monitor is conducted on the battery, the terminal device is kept in a state of nearly no power consumption, that is, the battery is kept in a natural discharge state, which can avoid inaccuracy in detection due to power consumption of the display or power consumption of applications.

In addition, charging of the terminal device being completed and the terminal device remaining coupled with the adaptor refers to the battery of the terminal device being fully charged and the adaptor being still coupled with the terminal device. In this state, the recharge information of the battery of the terminal device, such as the number of times of recharging, time interval of recharging, or the like, is acquired.

For instance, when an AC power supply is adopted to supply power, a majority of devices are unable to utilize AC to work. Instead, the AC, such as a 220V AC, received from the AC power supply is converted via the adaptor, such as a charger, and then is adopted to charge the battery of the terminal device.

As an implementation, the terminal device includes a charging management module, such as a charging IC of the terminal device. The charging management module is configured to manage charging voltage and/or charging current of the battery when the battery is charged. The charging management module functions as a voltage feedback module and/or a current feedback module to achieve management of the charging voltage and/or the charging current of the battery. At the same time, the terminal device can communicate with the adaptor and send information of the battery to the adaptor to manage the charging voltage and/or the charging current of the battery via the adaptor.

For example, when the battery is charged, a trickle charging can be conducted on the battery in the beginning. Then a constant-current charging and a constant-voltage charging can be conducted on the battery. When the charging voltage reaches up to 4.2V and the charging current is smaller than 100 mA, it can be determined that the battery is fully charged. Due to the fact that a user has not yet pulled the plug out of the adaptor (such as a charger), which indicates that the adaptor (such as the charger) is still coupled with the terminal device, whether to trigger the recharge condition can be determined by monitoring voltage of the battery and thus the acquiring module 110 can acquire the recharge information of the terminal device.

The safety monitoring module 130 is configured to determine whether the battery of the terminal device is abnormal according to the recharge information of the terminal device.

When the battery of the terminal device is abnormal due to damage, the damaged battery can trigger the recharge condition very easily due to its self-consuming current of short circuit.

Specifically, in an implementation of the disclosure, as illustrated in FIG. 2, a recharging voltage threshold value of the recharge condition is set to 4.25V. When the battery of the terminal device is abnormal due to damage, the recharge condition can be triggered multiple times within a certain time period. When the battery is recharged, charging current can increase. When the battery is in a normal state, the voltage of the battery remains nearly constant, the recharge condition will not be triggered within a certain time period generally, and thus there is no recharging current.

Therefore, in the implementation of the disclosure, when charging of the terminal device is completed and the terminal device remains coupled with the adaptor, in response to the terminal device being in a low-power state (excluding interference of power consumption of the terminal device itself), whether the battery of the terminal device is abnormal can be identified by monitoring the number of times the battery is recharged within a certain time, to avoid potential safety hazard caused by the abnormal battery.

According to an implementation of the disclosure, the recharge information of the terminal device includes the number of times the battery is recharged within a preset time and/or a time interval at which the battery is recharged.

Figure 5:
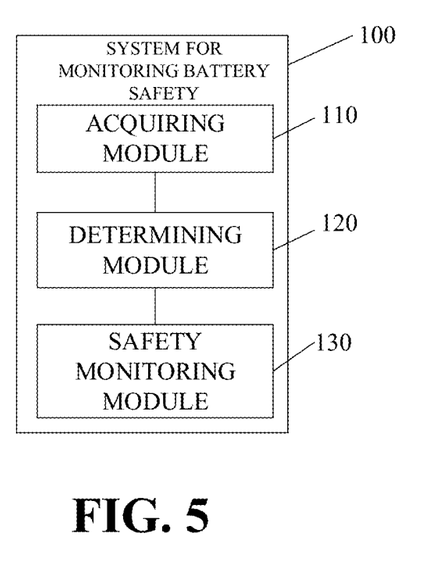
FIG. 5 is a schematic block diagram illustrating a system for monitoring battery safety according to another implementation of the present disclosure.

In addition, as illustrated in FIG. 5, in an implementation of the disclosure, the above system for monitoring battery safety further includes a determining module 120. The determining module 120 is configured to determine whether the number of times the battery is recharged within a preset time is greater than a preset number of times and/or determine whether the time interval at which the battery is recharged is shorter than a preset time interval. When the number of times the battery is recharged within a preset time is greater than or equal to a preset number of times and/or the time interval at which the battery is recharged is shorter than a preset time interval, the safety monitoring module 130 is configured to determine that the battery is abnormal, where the preset time is longer than the preset time interval.

In other words, in an implementation of the disclosure, the recharge information of the terminal device can include the number of times the battery is recharged within a preset time. That is to say, when the terminal device remains coupled with the adaptor after charging of the terminal device is completed, in response to the terminal device being in a low-power state, monitor the number of times the recharge condition is triggered within a preset time such as several hours, and when the number of times the recharge condition is triggered is greater or equal to a preset number of times such as two to five times, the safety monitoring module 130 can be configured to determine that there is some consuming current of short circuit in the battery, which indicates that there is an internal short circuit of the battery, and that the battery is abnormal accordingly.

In another implementation of the disclosure, the recharge information of the terminal device can include the number of times the battery is recharged within a preset time and a time interval at which the battery is recharged. That is to say, when the terminal device remains coupled with the adaptor after charging of the terminal device is completed, in response to the terminal device being in a low-power state, monitor the number of times the recharge condition is triggered within a preset time such as several hours. At the same time, in order to improve accuracy in monitoring, monitor the time interval at which the recharge condition is triggered. When number of times the recharge condition is triggered within a preset time is greater or equal to a preset number of times such as two to five times and the time interval at which the recharge condition is triggered is shorter than a preset time interval such as half an hour to one hour and a half, the safety monitoring module 130 can be configured to determine that there is some consuming current of short circuit in the battery, which indicates that there is an internal short circuit of the battery, and that the battery is abnormal accordingly.

In yet another implementation of the disclosure, the recharge information of the terminal device can include the time interval at which the battery is recharged. That is to say, when the terminal device remains coupled with the adaptor after charging of the terminal device is completed, in response to the terminal device being in a low-power state, monitor the time interval at which the recharge condition is triggered. When the time interval at which the recharge condition is triggered is shorter than a preset time interval such as half an hour to one hour and a half, the safety monitoring module 130 can be configured to determine that there is some consuming current of short circuit in the battery, which indicates that there is an internal short circuit in the battery, and that the battery is abnormal accordingly.

To summarize, according to the system for monitoring battery safety of implementations of the disclosure, when the terminal device remains coupled with the adaptor after charging of the terminal device is completed, in response to the terminal device being in a low-power state, monitor whether the battery of the battery is recharged and the recharge information of the battery of the terminal device to determine whether there is self-consuming current due to the internal short circuit of the battery, thereby identifying accurately whether the battery is abnormal.

It can be understood that, operations of executing monitoring can be completed by the terminal device or by the adaptor. In case that whether the battery is abnormal is monitored by the adaptor, the adaptor further communicates with the terminal device to send monitored information indicating that the battery is abnormal to the terminal device such that the terminal device can send alert information. Alternatively, the adaptor itself can also send the alert information, or both the terminal device and the adaptor can send the alert information simultaneously.

As an implementation, in case that whether the battery is abnormal is monitored by the terminal device, the terminal device further communicates with the adaptor to send the monitored information on the battery being abnormal to the adaptor and make the adaptor send alert information. Alternatively, the terminal device itself can also send the alert information, or both the terminal device and the adaptor can send the alert information simultaneously.

According to an implementation of the disclosure, when the battery is abnormal, alert information on the battery being abnormal is sent by the terminal device.

For example, when the battery is monitored to be abnormal, it is necessary to send alert information to a user. As an implementation, as illustrated in FIG. 3, the user can be reminded by such alert information as "Battery safety notification: dear customer, your battery is abnormal due to damage at present. For your safety, please get your terminal device inspected and repaired at xxx branch of service. Thank you". As another implementation, when the user is reminded by the alert information illustrated in FIG. 3, the user can be further reminded by an indicator light flashing. For example, control the indicator light to flash in red light at a high frequency. As yet another implementation, the user can be further reminded by a voice announcement function of the terminal device.

In general, when the user receives the above alert information, the user can promptly get the terminal device inspected and repaired. However, some users fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In an implementation of the disclosure, when the battery is abnormal, the safety monitoring module 130 is configured to determine a fault grade according to the number of times the battery is recharged within a preset time and/or the time interval at which the battery is recharged and corresponding functions of the terminal device are restricted according to the fault grade.

It can be understood that, when an internal short circuit of the battery occurs due to damage of the battery, an extent of the internal short circuit varies with an extent of the damage, and corresponding consuming current of short circuit also differs. In general, a larger extent of damage results in a larger extent of the internal short circuit and greater short circuit self-consuming current, thereby resulting in a greater number of times the battery is recharged within a preset time and/or a shorter interval at which the battery is recharged. Therefore, the safety monitoring module 130 can be configured to determine the fault grade according to the number of times the battery is recharged within a preset time and/or the time interval at which the battery is recharged.

For example, damage of the battery can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device are restricted according to the fault grade.

In an implementation of the disclosure, the fault grade of the battery can be determined by the adaptor and then fault grade information is sent to the terminal device to restrict corresponding functions of the terminal device.

In another implementation of the disclosure, the fault grade of the battery can be also determined by the terminal device and then some functions of the terminal device are restricted according to the fault grade.

For instance, generally speaking, lower power consumption of applications of the terminal device leads to lower heating when the battery is in use. Exemplarily, an IM application is only launched without a video chat. In this case, power consumption is low, heating of the battery is low, and thus risks of the battery are less likely to occur. However, when power consumption of the applications is high, such as watching a video, playing a mobile game, etc., power consumption of the battery is high and heating of the battery is high, which can easily cause accidents. Therefore, when the battery is determined to be abnormal, in case that the fault grade is the average grade, forbid use of applications of high power consumption such as video applications, game applications, etc.; in case that the fault grade is the relatively serious grade or the serious grade, forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display of the terminal device to remind the user; in case that the fault grade is the complete fault grade, battery failure occurs and the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "due to damage of the battery, charging of the battery is forbidden. Please get the terminal device inspected and repaired at xxx branch of service. Thank you for your cooperation" is displayed on the display of the terminal device to remind the user.

According to the system for monitoring battery safety according to implementations of the disclosure, when the terminal device remains coupled with the adaptor after charging of the terminal device is completed, in response to the terminal device being in a low-power state, the safety monitoring module is configured to acquire the recharge information of the terminal device to determine whether the battery of the terminal device is abnormal. That is to say, when the battery is damaged, a short circuit occurs inside the battery. Due to an internal short circuit, there always exists current leakage in the damaged battery. In this way, after charging of the battery of the terminal device is completed, whether the battery is abnormal due to damage can be accurately monitored by monitoring the recharge information of the battery. When the battery is monitored to be abnormal, prompt alert and repair can be conducted to avoid potential safety hazard caused by the abnormal battery, which can substantially improve safety of the terminal device in use.

Figure 6:
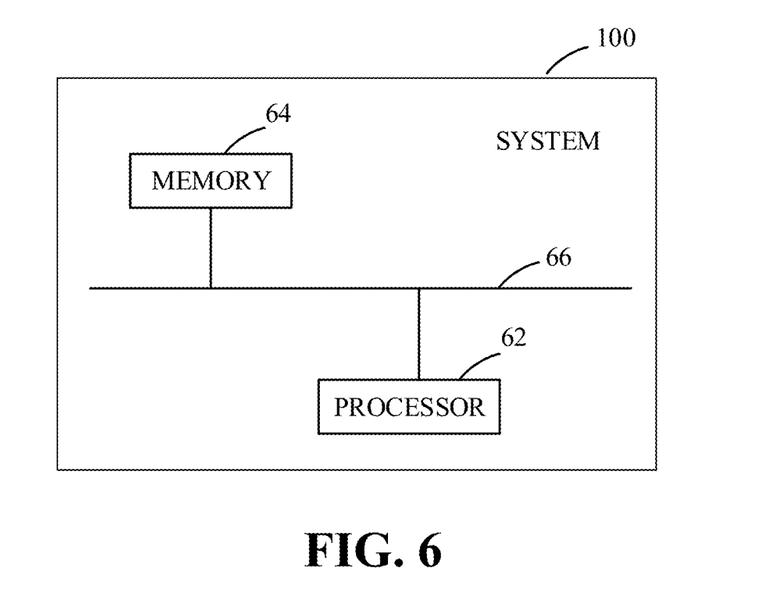
FIG. 6 is a schematic block diagram illustrating a system for monitoring battery safety according to another implementation of the present disclosure.

The foregoing mentioned units or modules can be implemented by a processor or can be integrated into a processor. To this end, FIG. 6 illustrates a block diagram of a system for monitoring battery safety 100 according to an implementation of the disclosure. The system 100 includes at least one processor 62 (only one processor is illustrated in the figure) and a computer readable storage 64 such as a memory. The computer readable storage 64 is coupled to the at least one processor 62 via a bus 66 for example and stores at least one computer executable instruction thereon. When executed by the at least one processor, the computer executable instruction can cause the at least one processor to carry out the method for monitoring battery safety mentioned above, which will not be repeated herein.

The system for monitoring battery safety according to implementations of the disclosure can be embodied in an adapter (that is, charging device) or a terminal device (that is, a device to be charged or a rechargeable device), which will be detailed below separately.

Figure 7:
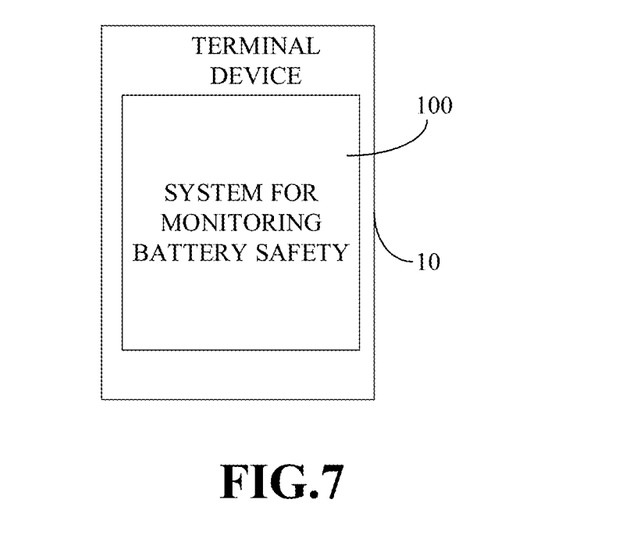
FIG. 7 is a schematic block diagram illustrating a terminal device according to an implementation of the present disclosure.

As illustrated in FIG. 7, a terminal device 10 is provided in an implementation of the disclosure. The terminal device 10 includes the above system for monitoring battery safety 100.

With the system for monitoring battery safety 100, the terminal device according to the implementation of the disclosure can be configured to monitor the recharge information of the battery to monitor whether the battery is abnormal due to damage, after charging of the battery of the terminal device is completed. When the battery is monitored to be abnormal, prompt alert and repair can be conducted to avoid potential safety hazard caused by the abnormal battery, which can substantially improve safety of the terminal device in use.

Figure 8:
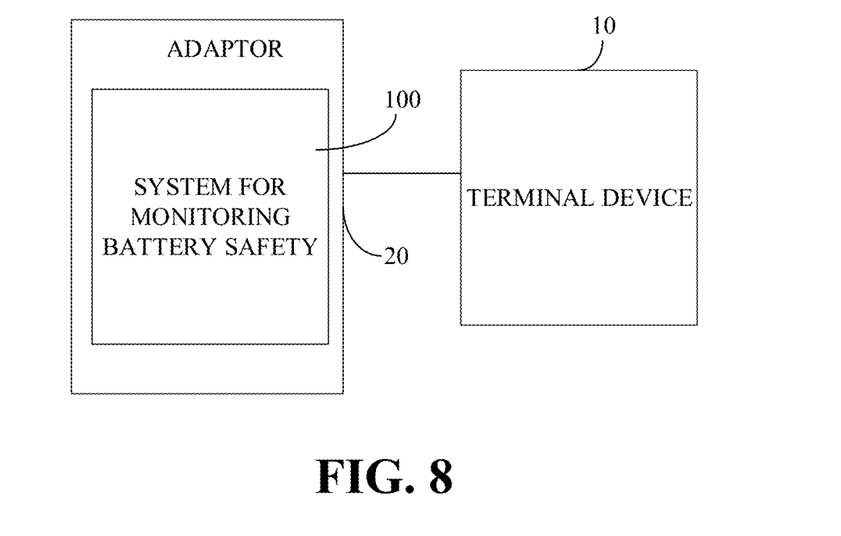
FIG. 8 is a schematic block diagram illustrating an adaptor according to an implementation of the present disclosure.

As illustrated in FIG. 8, an adaptor 20 is proposed according to an implementation of the disclosure. The adaptor 20 is configured to communicate with the terminal device 10, and the adaptor 20 includes the above system for monitoring battery safety 100.

With the system for monitoring battery safety 100, the adaptor according to the implementation of the disclosure can be configured to monitor the recharge information of the battery to monitor whether the battery is abnormal due to damage by the above system for monitoring battery safety, after charging of the battery of the terminal device is completed. When the battery is monitored to be abnormal, prompt alert and repair can be conducted to avoid potential safety hazard caused by the abnormal battery, which can substantially improve safety of the terminal device in use.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. It can be understood by those skilled in the art specific implications of the above terms in the present disclosure according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an implementation", "some implementations", "implementation", "specific implementation", or "some implementations" referred to herein means that a particular feature, structure, material, or characteristic described in conjunction with the implementation or implementation may be contained in at least one implementation or implementation of the present disclosure. The phrase appearing in various places in the specification does not necessarily refer to the same implementation or implementation, nor does it refer to an independent or alternative implementation or implementation that is mutually exclusive with other implementations or implementations. In addition, when the implementation or implementation is not mutually exclusive with other implementations or implementations, it is expressly and implicitly understood by those skilled in the art that an implementation described herein may be combined with other implementations or implementations.

Those of ordinary skill in the art will appreciate that units (including sub-units) and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity and will not be repeated herein.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations.

The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain implementations, it is to be understood that the disclosure is not to be limited to the disclosed implementations but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for abnormity detection of a rechargeable battery of a terminal device, the method comprising:
    acquiring recharge information of a terminal device, in response to the terminal device being in a low-power state, when the terminal device remains coupled with an adaptor after charging of a rechargeable battery of the terminal device via the adaptor is completed, wherein the low-power state is a standby state or a power off-state, and wherein the recharge information of the terminal device comprises a number of times the rechargeable battery is recharged within a preset time period and a time interval at which the rechargeable battery is recharged;
    determining whether the number of times the rechargeable battery is recharged within the preset time period is greater than a preset number of times and whether the time interval at which the rechargeable battery is recharged is shorter than a preset time interval; and
    determining that the rechargeable battery is abnormal, based on a determination that the number of times the rechargeable battery is recharged within the preset time period is greater than or equal to the preset number of times and the time interval at which the rechargeable battery is recharged is shorter than the preset time interval, the preset time period being longer than the preset time interval.

2. The method of claim 1, wherein acquiring the recharge information of the terminal device comprises:
    acquiring the recharge information of the terminal device by monitoring a voltage of the rechargeable battery.

3. The method of claim 2, wherein acquiring the recharge information of the terminal device by monitoring the voltage of the rechargeable battery comprises:
    determining that a recharge condition is triggered when the voltage of the rechargeable battery is less than a voltage threshold;
    determining the number of times the recharge condition is triggered with the preset time period to be the number of times the rechargeable battery is recharged within the preset time period; and
    determining a time interval at which the recharge condition is triggered to be the time interval at which the rechargeable battery is recharged.

4. The method of claim 1, further comprising:
    determining a fault grade according to the recharge information acquired and restricting corresponding functions of the terminal device according to the fault grade, based on a determination that the rechargeable battery is abnormal.

5. The method of claim 4, further comprising:
    establishing correspondence between functions of the terminal device and fault grades; and
    restricting corresponding functions of the terminal device according to the fault grade comprising:
        determining functions corresponding to the fault grade determined; and
        disabling the functions determined within a preset period.

6. The method of claim 1, further comprising:
    sending, by the terminal device, alert information of the rechargeable battery being abnormal, when the rechargeable battery is abnormal.

7. A system for abnormity detection of a rechargeable battery of a terminal device, the system comprising:
    at least one processor; and
    a computer readable storage, coupled to the at least one processor and storing at least one computer executable instruction thereon which, when executed by the at least one processor, causes the at least one processor to:
        acquire recharge information of a terminal device, in response to the terminal device being in a low-power state, when the terminal device remains coupled with an adaptor after charging of a rechargeable battery of the terminal device via the adaptor is completed, wherein the low-power state is a standby state or a power off-state, and wherein the recharge information of the terminal device comprises a number of times the rechargeable battery is recharged within a preset time period and a time interval at which the rechargeable battery is recharged;
        determine whether the number of times the rechargeable battery is recharged within the preset time period is greater than a preset number of times and whether the time interval at which the rechargeable battery is recharged is shorter than a preset time interval; and
        determine that the rechargeable battery is abnormal, based on a determination that the number of times the rechargeable battery is recharged within the preset time period is greater than or equal to the preset number of times and the time interval at which the rechargeable battery is recharged is shorter than the preset time interval, the preset time period being longer than the preset time interval.

8. The system of claim 7, wherein the at least one processor configured to acquire the recharge information of the terminal device is configured to:
    acquire the recharge information of the terminal device by monitoring a voltage of the rechargeable battery.

9. The system of claim 8, wherein the at least one processor configured to acquire the recharge information of a-the terminal device by monitoring voltage of the rechargeable battery is configured to:
    determine that a recharge condition is triggered when the voltage of the rechargeable battery is less than a voltage threshold;
    determine the number of times the recharge condition is triggered with the preset time period to be the number of times the rechargeable battery is recharged within the preset time period; and
    determine a time interval at which the recharge condition is triggered to be the time interval at which the rechargeable battery is recharged.

10. A non-transitory computer readable storage medium storing computer programs which, when executed by a processor, are operable with the processor to:
    acquire recharge information of a terminal device, in response to the terminal device being in a low-power state, when the terminal device remains coupled with an adaptor after charging of a rechargeable battery of the terminal device via the adaptor is completed, wherein the low-power state is a standby state or a power off-state, and wherein the recharge information of the terminal device comprises a number of times the rechargeable battery is recharged within a preset time period and a time interval at which the rechargeable battery is recharged;

determine whether the number of times the rechargeable battery is recharged within the preset time period is greater than a preset number of times and whether the time interval at which the rechargeable battery is recharged is shorter than a preset time interval; and determine that the rechargeable battery is abnormal, based on a determination that the number of times the rechargeable battery is recharged within the preset time period is greater than or equal to the preset number of times and the time interval at which the rechargeable battery is recharged is shorter than the preset time interval, the preset time period being longer than the preset time interval.

11. The non-transitory computer readable storage medium of claim 10, wherein the recharge information is acquired by monitoring a voltage of the rechargeable battery.

* * * * *